United States Patent [19]

Baliga et al.

[11] Patent Number: 5,318,915
[45] Date of Patent: Jun. 7, 1994

[54] METHOD FOR FORMING A P-N JUNCTION IN SILICON CARBIDE

[75] Inventors: Bantval J. Baliga; Dev Alok; Mohit Bhatnagar, all of Raleigh, N.C.

[73] Assignee: North Carolina State University at Raleigh, Raleigh, N.C.

[21] Appl. No.: 8,203

[22] Filed: Jan. 25, 1993

[51] Int. Cl.$^5$ .......................................... H01L 21/20
[52] U.S. Cl. ................................... 437/24; 437/31; 437/100; 437/151; 437/174
[58] Field of Search ...................... 437/100, 20, 22, 24, 437/31, 101, 151, 174, 25; 148/DIG. 83, DIG. 148

[56] References Cited

U.S. PATENT DOCUMENTS

| | | | |
|---|---|---|---|
| 4,567,502 | 1/1986 | Nakagawa et al. | 257/490 |
| 4,916,507 | 4/1990 | Boudou et al. | 437/24 |
| 4,945,394 | 7/1990 | Palmour et al. | 437/100 |
| 5,030,580 | 7/1991 | Furukawa et al. | 437/22 |
| 5,087,576 | 2/1992 | Edmond et al. | 437/100 |
| 5,248,385 | 9/1993 | Powell | 437/100 |
| 5,254,484 | 10/1993 | Hefner et al. | 437/25 |
| 5,270,244 | 12/1993 | Baliga | 437/25 |

OTHER PUBLICATIONS

Ghandhi "VLSI Fabrication principles" silicon and gallium arsenide pp. 324, 325, 1983.
Trew, Yan and Mock, "The Potential of Diamond and SiC Electronic Devices for Microwave and Millimeter-Wave Power Applications," Proceedings of the IEEE, vol. 79, No. 5, pp. 598-620, May, 1991.
Bhatnagar and Baliga, "Analysis of Silicon Carbide Power Device Performance", IEEE, pp. 176-180, 1991.
Pan and Steckl, "Reactive Ion Etching of SiC Thin Films by Mixtures of Fluorinated Gases and Oxygen", J. Electrochem. Soc., vol. 137, No. 1, pp. 212-220, Jan., 1990.
Davis, "Epitaxial Growth and Doping of and Device Development in Mono-crystalline β-SiC Semiconductor Thin Films," Thin Solid Films, vol. 181, pp. 1-15, Dec., 1989.
Shenai, Scott and Baliga, "Optimum Semiconductors for High-Power Electronics", IEEE Transactions on Electron Devices, vol. 36, No. 9, pp. 1811-1823, Sep., 1989.
Bumgarner, Kong, and Kim, et al., "Monocrystalline β-SiC Semiconductor Thin Films: Epitaxial Growth, Doping, and FET Device Development," 1988 Proceedings of the 38th Electronics Components Conf., pp. 342-349, 1988.
Daimon, Yamanaka, Shinohara, Sakuma, Misawa, Endo and Yoshida, "Operation of Schottky-Barrier Field Effect Transistors of 3C-SiC up to 400° C.", Appl. Phys. Lett., vol. 51, pp. 2106-2108, Dec., 1987.
(List continued on next page.)

Primary Examiner—R. Bruce Breneman
Assistant Examiner—Ramamohan Rao Paladugu
Attorney, Agent, or Firm—Bell, Seltzer, Park & Gibson

[57] ABSTRACT

A method for forming a p-n junction in silicon carbide includes the steps of amorphizing a portion of a monocrystalline silicon carbide substrate, implanting dopant ions into the amorphous portion of the substrate and then recrystallizing the amorphous portion to thereby form a substantially monocrystalline region including the dopant ions. In particular, the amorphizing step includes the steps of masking an area on the face of the monocrystalline silicon carbide substrate and then directing electrically inactive ions to the masked area so that an amorphous region in the substrate is formed. Accordingly, the amorphous region has sidewalls extending to the face that are substantially orthogonal to the bottom edge of the amorphous region. Once the amorphized region is defined, electrically active dopant ions are implanted into the amorphous region. The dopant ions are then diffused into the amorphous region and become uniformly distributed. Next, the doped amorphized region is recrystallized to obtain a substantially monocrystalline doped region. If the regions. surrounding the recrystallized region are of opposite conductivity type, a vertically walled p-n junction is formed.

10 Claims, 1 Drawing Sheet

OTHER PUBLICATIONS

Kelner, Binari, Sleger and Kong, "β-SiC MESFET's and Buried Gate JFET's", IEEE Electron Device Letters, vol. EDL-8, No. 9, pp. 428-430, Sep. 1987.

Kong, Palmour, Glass and Davis, "Temperature Dependence of the Current-Voltage Characteristics of Metal-Semiconductor . . . Via Chemical Vapor Deposition", Appl. Phys. Lett., vol. 51, pp. 442-444, Aug., 1987.

Kelner, Binari, Sleger and Kong, "β-SiC MESFETs", Mater. Res. Soc. Symp. Proc., vol. 97, pp. 227-232, Sep., 1987.

Edmond, Palmour, and Davis, "Chemical Etching of Ion Implanted Amorphous Silicon Carbide," J. Electrochem. Soc.: Solid-State Science and Technology, pp. 650-652, Mar., 1986.

Sugiura, Lu, Cadien and Steckl, "Reactive Etching of SiC Thin Films Using Fluorinated Gases", J. Vac. Sci. Technology.B 4 (1), pp. 349-355, Jan.-Feb., 1986.

Chang, Fang, Huong, and Wu, "Noval Passivation Dielectrics—The Boron- or Phosphorus-Doped Hydrogenated Amorphous Silicon Carbide Films", J. Electrochem. Soc.: Solid State Science and Technology, pp. 418-422, Feb., 1985.

McHargue, Lewis, Williams and Appleton, "The Reactivity of Ion-Implanted SiC", Materials Science and Engineering, vol. 69, pp. 391-395, 1985.

Palmour, Davis, Astell-Burt and Blackborow, "Effects of Cathode Materials and Gas Species on the Surface Characteristics of Dry Etched Monocrystalline Beta-SiC Thin Films", Silicon Carbide, pp. 491-550.

METHOD FOR FORMING A P-N JUNCTION IN SILICON CARBIDE

CROSS REFERENCE TO RELATED APPLICATIONS

This application is related to application Ser. No. 08/008,719, Pending, entitled METHOD OF FORMING TRENCHES IN/MONOCRYSTALLINE SILICON CARBIDE (Attorney Docket No. 5051-211); application Ser. No. 08/008,747, Pending, entitled SILICON CARBIDE FIELD EFFECT TRANSISTOR AND METHOD FOR FABRICATING SAME (Attorney Docket No. 5051-212); and U.S. Pat. No. 5,270,244, entitled METHOD FOR FORMING AN OXIDE-FILLED TRENCH IN SILICON CARBIDE (Attorney Docket No. 5051-217); all filed concurrently herewith, the disclosures of which are hereby incorporated herein by reference.

FIELD OF THE INVENTION

The present invention relates to microelectronic device manufacturing methods and more particularly to methods of manufacturing microelectronic devices in monocrystalline silicon carbide.

BACKGROUND OF THE INVENTION

As is well known to those having skill in the art, monocrystalline silicon carbide is particularly well suited for use in semiconductor devices, such as integrated circuit semiconductor devices and power semiconductor devices. Integrated circuit semiconductor devices typically include many active devices such as transistors in a single semiconductor substrate. Power semiconductor devices, which may be integrated circuit devices, are semiconductor devices which carry large currents and support high voltages.

Silicon carbide has a wide bandgap, a high melting point, a low dielectric constant, a high breakdown field strength, a high thermal conductivity and a high saturated electron drift velocity compared to silicon, which is the most commonly used semiconductor material. These characteristics allow silicon carbide microelectronic devices to operate at higher temperatures and higher power levels than conventional silicon based devices. In addition to the above advantages, silicon carbide power devices can operate with lower specific on-resistance than conventional silicon power devices. Some of the advantages of using silicon carbide for forming power semiconductor devices are described in articles by K. Shenai, R. S. Scott, and coinventor B. J. Baliga, entitled *Optimum Semiconductors for High-Power Electronics*, IEEE Transactions on Electron Devices, Vol. 36, No. 9, pp. 1811–1823 (1989); and by coinventors M. Bhatnagar and B. J. Baliga entitled *Analysis Of Silicon Carbide Power Device Performance*, ISPSD '91, Abstr. 8.3, pp 176–180 (1991).

Many of the processes for forming microelectronic devices require the formation of P-N junctions in a semiconductor substrate. Conventional techniques for forming P-N junctions in semiconductor substrates include, for example, in-situ doping during the growth of semiconductor layers, implantation and diffusion of deposited dopant species, as well as other conventional techniques. For semiconductors such as silicon, it is possible to obtain P-N junctions well beneath the surface of the substrate using diffusion since diffusion rates for dopants in silicon are relatively high even at relatively low temperatures on the order of 1000–1200 degrees Centigrade. Accordingly, it is possible to obtain P-N junctions in silicon as deep as 1–3 microns. In silicon carbide, however, the diffusion coefficients of conventional P and N-type dopants are small in the temperature range of 1000–1200 degrees Centigrade. In fact, temperatures on the order of 1500 degrees Centigrade and higher are generally required for diffusion to occur at appreciable rates.

For example, in an invited paper by R. J. Trew, J. B. Yah and P. N. Mock, entitled *The Potential of Diamond and SiC Electronic Devices for Microwave and Millimeter-Wave Power Applications*, Proc. of the IEEE, Vol. 79, No. 5, pp. 598–620 (1991), temperatures on the order of 1900 degrees Centigrade were specified as being required for the diffusion of N or P-type dopants in silicon carbide. Unfortunately, this extreme range of temperatures is not compatible with the fabrication of integrated semiconductor devices having multiple layers of different conductivity type material. These temperatures are also considerably above the melting point of $SiO_2$, a diffusion masking material having no commercially acceptable alternative for high temperature processing. Given these limitations, it is generally accepted that P-N junction formation arising from epitaxial growth or ion implantation with boron (B) or aluminum (Al) (p-type) or phosphorus (P) or nitrogen (N) (n-type) is most suitable for silicon carbide.

Unfortunately, although there has been a general acceptance of ion-implantation as a technique for forming P-N junctions in silicon carbide, problems including out-diffusion of dopant species, the precipitation of defect clusters, and the formation of electrically active line and point defects causing poor dopant ionization are encountered in the formation of lateral MESFETs and MOSFETs. For example, in an article by J. W. Bumgarner, H. S. Kong, H. J. Kim, J. W. Palmour, J. A. Edmond, J. T. Glass, and R. F. Davis, entitled *Monocrystalline β-SiC semiconductor Thin Films: Epitaxial Growth, Doping and FET Device Development*, 1988 Proc. 38th Electronics Components Conf., pp. 342–349, solid phase epitaxial re-growth of the amorphous regions caused by the implantation of boron was achieved by annealing at 1600 degrees Centigrade for 300 seconds. However, defect clusters of precipitates and vacancy loops formed near the center of the amorphous regions within the implanted region. Subsequent annealing at 1800 degrees Centigrade for 300 seconds promoted virtually defect free regrowth, but SIMS analysis revealed almost complete out-diffusion of the implanted boron ions.

The implantation of P or N-type dopant species also results in the formation of an implant profile having a peak concentration below the implant surface. As well understood by those skilled in the art, the implant profile can generally be approximated by a Gaussian curve, or for greater accuracy, a four-moment Pearson-IV curve. However, even after annealing, which may cause diffusion away from the peak concentration region, a non-uniform doping profile in the N or P-type region is present. Accordingly, it is difficult to achieve a great degree of uniformity in regions formed by ion implantation.

Thus, notwithstanding the general acceptance of ion-implantation as a technique for forming regions of P and N-type conductivity in silicon carbide, problems still exist in obtaining substantially monocrystalline silicon carbide regions with uniform doping throughout.

SUMMARY OF THE INVENTION

It is therefore an object of the present invention to provide a P-N junction in a monocrystalline silicon carbide substrate.

It is another object of the present invention to provide a P-N junction in a monocrystalline silicon carbide substrate, wherein both the P and N-type regions are substantially monocrystalline and relatively free of defect clusters and vacancy loops.

It is still another object of the present invention to provide a P-N junction in a monocrystalline silicon carbide substrate, wherein the regions forming the P-N junction are doped uniformly throughout.

These and other objects are provided, according to the present invention, by a method for forming a P-N junction in monocrystalline silicon by amorphizing a portion of a monocrystalline silicon carbide substrate to thereby define an amorphous silicon carbide region therein, implanting dopant ions of either N or P-type conductivity into the amorphous silicon carbide region, and recrystallizing the amorphous silicon carbide region to thereby form a substantially monocrystalline region including the dopant ions.

In particular, a portion of the semiconductor substrate is amorphized by preferably implanting electrically inactive ions into the portion of the monocrystalline silicon carbide substrate, wherein one of the regions of the P-N junction is to be formed, such that the implanted electrically inactive ions convert the portion into a region of amorphous silicon carbide. Such electrically inactive ions include those ions which do not provide N or P-type doping for silicon carbide, and may include silicon, carbon, argon, hydrogen, neon and helium. Generally, the ion implanting step comprises the steps of masking an area on the face of the substrate corresponding to the portion of the substrate to be amorphized and then directing electrically inactive ions to the face, such that the ions implant into the substrate in the region defined by the masked area, and amorphize the region.

The defined portion of the substrate becomes amorphous because during the electrically inactive ion implanting step, each ion undergoes scattering events with electrons and atoms in the defined portion. These scattering events cause point defects and amorphous disorder zones and reduce the ion's total energy until the ion comes to rest at some point below the surface of the substrate. The point defects and amorphous disorder zones are characterized by a relatively high concentration of dangling bonds as compared to the surrounding monocrystalline regions.

Next, P-type dopant ions such as boron (B) or aluminum (Al), or N-type dopant ions such as phosphorus (P) or nitrogen (N) are implanted into the amorphous silicon carbide region. Unlike the first implant step, however, the dopant ions are implanted to form a relatively shallow implant layer in the amorphous region. Thereafter, the dopant ions are diffused into the entire amorphous region, preferably using a post-implant anneal to drive-in and uniformly distribute the dopant ions in the amorphous silicon carbide region. While not wishing to be bound by any theory, it is believed that the diffusion rate of dopant impurities in amorphous silicon carbide is substantially greater than that for monocrystalline silicon carbide because of the presence of the point defects and amorphous zones created by the electrically inactive ion implanting step. Moreover, because the depth of the P-N junction is determined by the amorphizing step and the implant range of the electrically inactive ions, the range of the implanted dopant ions is decoupled from the depth of the junction.

Accordingly, the method for forming a P-N junction according to the present invention includes a first implant step preferably using electrically inactive ions for amorphizing a portion of the substrate and a second implant step, wherein the actual dopants are implanted into the substrate, near the surface. Because the portion of the substrate is amorphized prior to the shallow implantation and diffusion of the dopants, the diffusion kinetics of the dopants in amorphous silicon carbide control the dopant profile and electrical characteristics of the subsequent P-N junction formed in the substrate. Moreover, because the amorphizing step is not performed using the dopant ions as described in the art, the kinetics associated with the implantation of either P or N-type impurities, which vary depending on the type of dopant impurity used, does not significantly control the characteristics of the P-N junction ultimately formed. This makes the method described herein reproducible for a wide variety of dopants in silicon carbide and compatible with other technologies, such as those based in silicon and gallium arsenide.

Subsequent to the annealing step, a recrystallizing step is performed to convert the amorphous region into a substantially monocrystalline region with minimal point or line defects, grain boundaries, etc., that can degrade the electrical characteristics of the P or N-type region. The method for forming a P-N junction, according to the present invention, may also include the step of electrically activating the dopant ions in the recrystallized portion so that a substantial number of the implanted dopants contribute to conduction by providing donor or acceptor sites for electron or hole carrier transfer.

Thus, according to the present invention, doped junctions in silicon carbide can be obtained by using a combination of implantation and diffusion steps. The doped region will include electrically inactive ions which are implanted during the first implant step and electrically active dopant ions which are implanted during the second implant step and contribute to conduction as either donor or acceptor ions. Also, because the physical dimensions of the doped region depend on the three-dimensional implant profile caused by the initial amorphizing step, the doped region will have a bottom edge in the substrate and sidewalls extending substantially orthogonal from the bottom edge to the face of the substrate. As will be understood by one skilled in the art, the distance between the face and the bottom edge of the doped region corresponds to the depth of the implant region formed during the amorphizing step.

Unlike the prior art, which to the best of the inventors' knowledge requires the implantation of the dopant species into monocrystalline silicon carbide, the present invention forms an amorphous region, followed by the shallow implantation of the dopant species into the amorphous region and subsequent. diffusion to uniformly distribute the dopants.

DESCRIPTION OF PREFERRED EMBODIMENTS

Figure 1A:
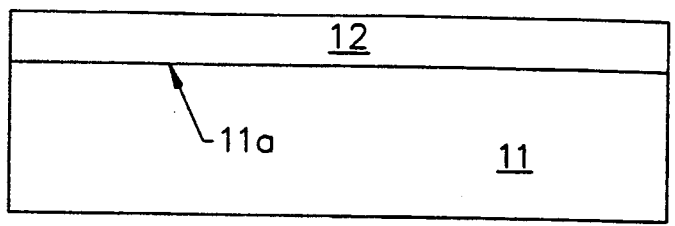
FIGS. 1A–1F are cross-sectional side views of a monocrystalline silicon carbide substrate during intermediate processing steps for forming a P-N junction therein according to the present invention.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

Figure 1B:
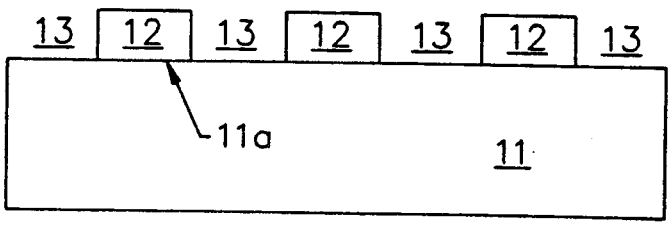

Referring now to FIGS. 1A–1F, a method for forming a P-N junction in silicon carbide according to the present invention will now be described. As shown in FIG. 1A, a monocrystalline silicon carbide substrate 11 is provided. For example, a 6H or 3C monocrystalline silicon carbide substrate may be used. A mask 12, such as a 2 $\mu$m thick photoresist layer, is formed on face 11a of substrate 11 using standard techniques. As shown in FIG. 1B, mask 12 is patterned to expose areas 13 on face 11a corresponding to the portions of the substrate wherein amorphous regions are to be formed. The masking and patterning techniques are conventional and need not be further described herein.

Figure 1C:
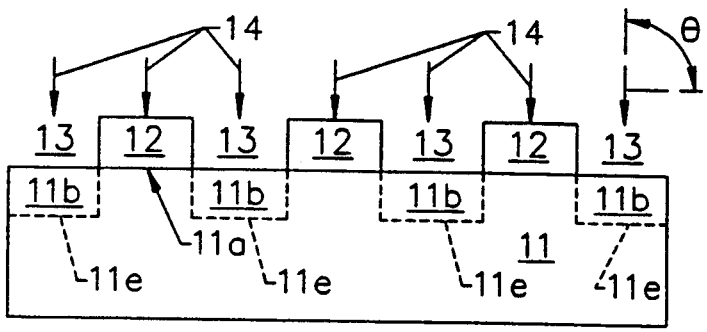

Referring now to FIG. 1C, electrically inactive ions 14 are preferably directed to the face 11a of the silicon carbide substrate 11 and implant into the silicon carbide substrate through the exposed areas 13. The type of ion 14 used, the dosage and implant energy are chosen so that the implanted ions 14 create amorphous regions 11b in the silicon carbide substrate 11, from the first face 11a to a desired depth, thereby creating a bottom edge 11e.

There are a number of ions which can be implanted into monocrystalline silicon carbide to thereby create amorphous regions. The TABLE below illustrates ions which can be used, and the dose to produce a desired depth of amorphous region 11b at 200 keV energy. It will also be understood by those having skill in the art that lighter ions such as hydrogen typically penetrate the substrate to a greater depth than heavier ions such as argon, for a given implant dose. Multiple implants at different energies may be used to amorphize region 11b, in order to obtain a uniform amorphous region at the desired depth.

| Implanted Ion | Depth of Amorphous Region (Å) | Dose (cm$^{-2}$) |
| --- | --- | --- |
| Ar++ | 5000 | 6E14 |
| Ar+ | 2100 | 4.8E14 |
| C+ | 6000 | 7E14 |
| He+ | 9000 | 1E17 |
| Si+ | 2800 | 8E14 |
| H+ | 15,000 | 2E18 |
| Ne+ | 4000 | 2E15 |

It will be understood by those having skill in the art that ion implantation can be performed in a highly directional manner. Accordingly, as shown in FIG. 1C, the ions 14 may be implanted in a substantially vertical direction (i.e. orthogonal to face 11a such that angle $\theta$ is 90°), to thereby form amorphized regions 11b with vertical walls. However, it will also be understood by those having skill in the art that if other junction profiles are desired, implantations including a horizontal component, or directional implantations at oblique angles $\theta$, may be performed.

Figure 1D:
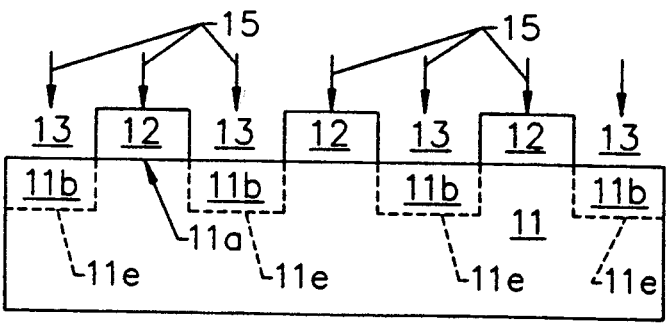

Referring now to FIG. 1D, after the formation of the amorphous regions 11b, a desired dopant 15 of N or P-type conductivity is implanted into the surface of the amorphous regions 11b. For example, the desired dopant may include P-type dopant ions such as boron (B) or aluminum (Al), or N-type dopant ions such as phosphorus (P) or nitrogen (N). Since an amorphous region 11b has already been created, it is not necessary to implant the desired dopant ions 15 at the high energies that would otherwise be required if the dopant ion implanting step were being made to define the region for forming the P-N junction and simultaneously provide the appropriate dopant. For example, if a conventional single dopant implanting step were performed to form the P-N junction, implant concentrations on the order of $10^{14}$/cm$^2$ at energies on the order of 100 KeV would be required.

Figure 1E:
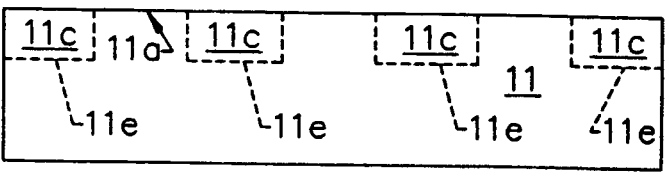

Referring now to FIG. 1E, following the dopant ion implanting step, a separate step for annealing the substrate to thereby drive-in and uniformly distribute the dopants 15 in the amorphized region 11b is preferably performed at conventional diffusion temperatures, on the order of 1000–1200 degrees Centigrade, to cause the formation of a uniformly doped amorphous region 11c. The uniform redistribution of the dopant ions 15 in the amorphous region is facilitated by a physical characteristic of the amorphous region. In particular, during the amorphizing step, numerous lattice vacancies are generated in the region exposed to the electrically inactive ions. The presence of these vacancies allows for the relatively fast rate of diffusion of the implanted dopants throughout the amorphized region as compared to the rate of diffusion of dopants in the adjacent monocrystalline silicon carbide regions.

Moreover, because the single step of implanting the dopants 15 is omitted in favor of a two-step amorphizing and shallow implant method, it is not necessary to implant an excessively high concentration of dopants in order to obtain the proper dopant concentration at the bottom edge 11e of the P-N junction. As will be understood by one skilled in the art, the Gaussian-like implant profile that would otherwise be obtained if a single dopant implant step were used to define and dope the P-N junction region, causes the doping concentration at the bottom edge 11e of the P-N junction to be along the "tail" of the Gaussian-like distribution and therefore less than the "peak" or excess concentration obtained somewhere between the bottom edge 11e and the face 11a. In addition, because of the presence of the peak concentration in the single step approach, uniform doping throughout the implanted region is not readily obtained because the peak is retained even though subsequent diffusion occurs.

Figure 1F:
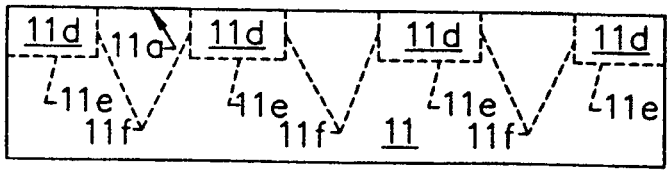

Referring now to FIG. 1F, at the same time or subsequent to the annealing step or dopant ion implanting step, the amorphous doped region 11c is recrystallized to obtain a substantially monocrystalline doped region 11d. The recrystallizing step can be performed using conventional techniques such as solid phase epitaxy. Rapid thermal annealing and laser-assisted heating can also be used to aid the recrystallizing process to thereby form a substantially monocrystalline doped region 11d with relatively few lattice defects.

Because of the two-step amorphizing and dopant implant method, the doped region 11d will include both the electrically inactive ions as well as the desired donor or acceptor dopant ions. This is in contrast with prior art P-N junctions, formed using a single dopant implanting step, which do not include the electrically inactive ions. Also, because the physical dimensions of the doped region 11d depend on the physical characteristics of the three-dimensional implant profile, the doped region will have a bottom edge 11e and sidewalls 11f extending substantially orthogonal from the bottom edge to the face 11a of the substrate 11. As will be understood by one skilled in the art, the distance between the face 11a and the bottom edge 11c of the doped region corresponds to the depth of the region formed by the amorphizing step.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of forming a silicon carbide junction in a monocrystalline silicon carbide substrate, comprising the steps of:
    amorphizing a portion of a monocrystalline silicon carbide substrate to thereby define an amorphous silicon carbide region in the monocrystalline silicon carbide substrate and extending to a face thereof;
    subsequently implanting dopant ions into a surface portion of said amorphous silicon carbide region;
    uniformly distributing the dopant ions in the surface portion, into said amorphous silicon carbide region by annealing said amorphous silicon carbide region; and
    recrystallizing said amorphous silicon carbide region to thereby form a substantially monocrystalline region including the dopant ions.

2. The method of claim 1, wherein the substrate is of first conductivity type and wherein said dopant ion implanting step comprises the step of implanting dopant ions of second conductivity type into the surface portion of said amorphous silicon carbide region.

3. The method of claim 1, wherein said uniformly distributing step and said recrystallizing step are performed simultaneously.

4. The method of claim 1 wherein said amorphizing step comprises the step of:
    implanting ions into the portion of the monocrystalline silicon carbide substrate, such that the implanted ions convert the portion into a region of amorphous silicon carbide.

5. The method of claim 4 wherein said ion implanting step comprises the steps of:
    masking an area on the face of the monocrystalline silicon carbide substrate; and
    directing ions to the face of the monocrystalline silicon carbide substrate, such that the ions implant into the substrate in the region defined by the masked area and convert the portion into a region of amorphous silicon carbide.

6. The method of claim 5, wherein said ion directing step comprises the step of directing electrically inactive ions, selected from the group consisting of silicon, hydrogen, neon, helium, carbon and argon to the face of the monocrystalline silicon carbide substrate.

7. A method of forming a silicon carbide junction in a monocrystalline silicon carbide substrate, comprising the steps of:
    masking an area on a face of a monocrystalline silicon carbide substrate;
    directing electrically inactive ions to the face, such that the ions implant into the substrate in the region defined by the masked area and convert a portion of the monocrystalline silicon carbide substrate into a region of amorphous silicon carbide;
    subsequently implanting dopant ions into a surface portion of said amorphous silicon carbide region;
    uniformly distributing the dopant ions in the surface portion, into said amorphous silicon carbide region by annealing said amorphous silicon carbide region; and
    recrystallizing said amorphous silicon carbide region to thereby form a substantially monocrystalline region including the dopant ions.

8. The method of claim 7, wherein the substrate is of first conductivity type and wherein said dopant ion implanting step comprises the step of implanting dopant ions of second conductivity type into the surface portion of said amorphous silicon carbide region.

9. The method of claim 7, wherein said electrically inactive ion directing step comprises the step of directing ions, selected from the group consisting of silicon, hydrogen, neon, helium, carbon and argon to the face of the monocrystalline silicon carbide substrate.

10. The method of claim 7, wherein said uniformly distributing step and said recrystallizing step are performed simultaneously.

* * * * *